United States Patent [19]

Cronin

[11] Patent Number: 4,768,002
[45] Date of Patent: Aug. 30, 1988

[54] POWER FILTER RESONANT FREQUENCY MODULATION NETWORK

[75] Inventor: Donald L. Cronin, Anaheim, Calif.

[73] Assignee: Triad Microsystems, Inc., Orange, Calif.

[21] Appl. No.: 17,718

[22] Filed: Feb. 24, 1987

[51] Int. Cl.$^4$ .................... H03H 7/01; H03H 7/09
[52] U.S. Cl. .................... 333/177; 333/167; 333/176; 333/181; 363/47
[58] Field of Search ............ 333/167, 174, 176, 177, 333/179, 181–185, 12, 175; 336/30, 16, 170; 363/44, 45, 47, 48, 125, 128

[56] References Cited

U.S. PATENT DOCUMENTS

| | | | |
|---|---|---|---|
| 1,432,965 | 10/1922 | Casper | 333/168 |
| 1,822,929 | 9/1931 | Hund | 333/181 |
| 1,834,820 | 12/1931 | Bobb | |
| 1,835,015 | 12/1931 | Crouse | 333/100 |
| 1,998,325 | 4/1935 | Lyman, Jr. | 178/44 |
| 2,413,263 | 12/1946 | Suter | 333/174 X |
| 2,418,114 | 4/1947 | Frankel | 175/363 |
| 2,686,291 | 8/1954 | Macklem | 323/50 |
| 2,686,292 | 8/1954 | Macklem | 323/50 |
| 2,725,508 | 11/1955 | Bailey | 318/6 |
| 2,939,117 | 5/1960 | Brown | 340/174 |
| 3,184,675 | 5/1965 | Macklem | 323/50 |
| 3,223,920 | 12/1965 | Sasaki | 323/44 |
| 3,340,458 | 9/1967 | Keller | 321/10 |
| 3,436,692 | 4/1969 | Walters | 336/215 X |
| 3,745,416 | 7/1973 | Thanawala | 333/174 X |
| 4,378,522 | 3/1983 | Suladze et al. | 323/334 |
| 4,394,631 | 7/1983 | Pavlic | 333/132 |
| 4,409,569 | 10/1983 | Potash | 333/177 |
| 4,422,056 | 12/1983 | Roberts | 333/177 |
| 4,427,955 | 1/1984 | Roberts | 333/177 |
| 4,462,071 | 7/1984 | Blok | 363/44 |

FOREIGN PATENT DOCUMENTS 590166 1/1960 Canada .................... 333/174

Primary Examiner—Marvin L. Nussbaum
Attorney, Agent, or Firm—Gausewitz, Carr & Rothenberg

[57] ABSTRACT

A power filter resonant frequency modulation network for coupling between a load and a variable voltage direct current power source which is subjected to superposition of alternating current thereon at various frequencies and at various voltage levels, the filter including first and second series inductor arrangements in the positive and negative buses between the power supply and the load, with capacitive elements in parallel between the two buses. Each series inductor arrangement includes a first inductor in series with a frequency and voltage responsive inductive load device, which is a second inductor having a tertiary winding loaded with a coil wound about the core of a saturable reactor. The firing angles of the reactors are directly proportional to voltage and inversely proportional to voltage to provide a phase staggered change of inductance in the network. At higher frequencies and lower voltages, the loading reactors are out of saturation and present a very high impedance to the circuit, the effect resulting in a broadening of the normal high Q peaking within a range of frequencies at resonance.

15 Claims, 2 Drawing Sheets

POWER FILTER RESONANT FREQUENCY MODULATION NETWORK

BACKGROUND OF THE INVENTION

The background of the invention will be discussed in two parts.

FIELD OF THE INVENTION

This invention relates to filter networks, and more particularly to a power filter network providing resonant frequency modulation by use of a saturable reactor as part of an inductive load device, which is frequency and voltage responsive at frequencies near resonance.

DESCRIPTION OF THE PRIOR ART

Alternating current filter network designs commonly employ magnetic structures, such as inductors, along with capacitors, resistors and the like, in what are sometimes referred to as LRC networks, to provide a measure of control over the frequency of response of the system in which such networks are employed. When the alternating current frequency component at the input to the filter is constant, or predictable, filtering by use of LRC components is straightforward. However, with LRC filter circuits, where the AC component at the input varies over a large range of frequencies, the filter becomes more complex as a consequence of resonance occurring at a given frequency within the range of input frequencies.

In filters for power networks with multiple loads of various characteristics, the problem is more acute. In such power networks, the power source may be a battery or a rectified source of direct current. With active, as well as passive, loads being placed upon, and removed from, the power bus at different times, alternating current components of different frequencies and different voltage levels are superimposed on the director current bus. In certain applications both the value of the direct current voltage component, as well as the value of the frequencies superimposed thereon may vary within broad ranges. Furthermore, the load connected to such filters may likewise have some peculiar characteristics which are reflected in the filter gain or attenuation characteristics. In such filters, the objective is to provide a filter with optimum characteristics within the range of impedances of the load to be supplied through the filter, and with attenuation of frequencies at certain frequencies within the range of frequencies anticipated. Meeting these objectives becomes more complicated in certain environments of application where the total weight of the filter is a material consideration.

By way of example, with battery power sources for four wheeled or track type vehicles in military application, a vast amount of equipment may be on board, and may include radio transmitters and the like. Space craft direct current power sources have another order of magnitude of different types of loads connected to the power buses. With radio frequency equipment, radio frequency noise is generated at the load, and power filter networks are employed to attenuate this radio frequency noise and preclude electromagnetic intererce on the power lines from the RF noise. In such applications, noise generated from radio frequency sources is generally very high in frequency compared to the power source frequency resulting from rectification, load modulation or load control. Furthermore, the peak to peak voltage amplitude of such RF noise may be high compared to any AC ripple voltage amplitude. The requirements for such power filters in such severe applications has been set out by the government in MIL STD-461A, which specifies the frequencies of concern as the range of frequencies between 30 Hz and 50 kHz, with functional limits imposed on power filters in such applications.

In the prior art, a frequency attenuation circuit is shown and described in U.S. Pat. No. 1,432,965, issued Oct. 4, 1922 to Casper for "Electric Circuits". This patent is exemplary of the conventional LRC filter networks, and is in the nature of a bandpass filter, in which inductors, resistors and capacitors are employed, selectively, in series and parallel, with the values selected in accordance with the range of frequencies under consideration.

U.S. Pat. No. 1,822,929, entitled "Filter Circuit", issued on Sept. 15, 1931 to Hund, and discloses a filter network for eliminating the effects of cyclic changes in a half-wave or full wave rectified alternating current power supply source.

U.S. Pat. No. 1,834,820, entitled "Electrodynamic Sound Reproduction System", was issued on Dec. 1, 1931 to Robb, and discloses a filter for reducing hum effects in a loudspeaker.

Another filter network is disclosed in U.S. Pat. No. 1,835,015, entitled "Plate Circuit Excitation" issued Dec. 8, 1931 to Crouse, such patent describing circuitry for rectifying and filtering alternating components from a source of alternating current without introducing interstage coupling between a plurality of vacuum tube plate circuits which are supplied in parallel from the rectified current source.

U.S. Pat. No. 1,998,325, entitled "Uniform Impedance Circuit", was issued Apr. 16, 1935 to Lyman, Jr., and discloses a filter circuit providing uniform impedance and adapted to provide square wave keying in radio transmitters.

A "Rectifier Filter System" is shown in U.S. Pat. No. 2,418,114, issued Apr. 1, 1947 to Frankel, the filter utilizing a transformer having the secondary thereof shunted with a resistive load which is reflected in the primary, and which serves as an impedance to all frequency components of a rectifier and filter circuit except the steady direct current component.

U.S. Pat. No. 2,686,291, entitled "Variable Reluctance Control Means", issued to Macklem on Aug. 10, 1954 and in U.S. Pat. No. 2,686,292, issued to Macklem the same day and bearing the same title. In accordance with these patents, magnetic amplifier devices with vacuum tube controllers are used for the control of A.C. power in load devices.

In U.S. Pat. No. 2,725,508, issued Nov. 29, 1955 to Bailey et al, for an "Electronic Dancer Roll Control", a transformer and thyratron tubes are in circuit relation with a motor to be controlled, with the system using the saturating characteristics of the transformer as a method of control of the motor.

A non-filter use of a magnetic core is disclosed in U.S. Pat. No. 2,939,117, entitled "Magnetic Core Storage Device with Flux-controlling Auxiliary Windings", which issued to Brown on May 31, 1960.

A control system employing magnetic amplifier devices is shown and described in U.S. Pat. No. 3,184,675 entitled "Gated Control for Power Circuit", issued to Macklem on May 18, 1965. For this purpose, three-legged magnetic cores are employed with silicon controlled rectifiers in circuit relation with windings on one or more legs for effecting control of the flux paths induced by an alternating current source for controlling the load.

U.S. Pat. No. 3,223,920, entitled "Noise Suppressing Transformer", issued Dec.14, 195 to Sasaki, and shows the use of a tertiary winding in series with a resistor on a transformer as a means for compensating for the deterioration of frequency response of the noise suppressing characteristics of another main transformer.

U.S. Pat. No. 3,340,458, is entitled "Filter Choke With Self-Desaturating Magnetic Core, and issued to Keller on Sept. 5, 197, the filter including a magnetic core with an adjustable air gap, with a first induction coil wound about the core and a second induction coil wound about the core in inverted phase relationship as a means of removing ripple form rectified alternating current U.S. Pat. No. 4,378,522, entitled "Adjustable Current Source", which issued to Suladze et al on Mar. 29, 1983, shows a circuit in which a three legged magnetic amplifier is used in conjunction with a three phase variable voltage source as a load current matching and adjusting unit.

U.S. Pat. No. 4,394,631, entitled "Radio Frequency Choke and Method of Use", was issued on July 19, 1983 to Pavlic, and discloses a choke using a coil form made of a ferrite material, a powdered iron material, or the like.

U.S. Pat. No. 4,409,569, entitled "Filter Circuits Having Transformers as Filter Elements", was issued to Potash on Oct. 11, 1983, the filter circuit using two dual coil transformers to perform the function of four inductors.

U.S. Pat. No. 4,422,056, entitled "Integrated Multi-Stage Electrical Filter", was issued Dec. 20, 1983 to Roberts, and U.S. Pat. No. 4,427,955, entitled "Capacitor Structure for Integrated Multi-Stage Filter" was issued Jan. 24, 1984 to the same inventor. These patents disclose similarly configured multi-legged transformer core members with air gaps and windings, one of which includes a parallel RC connection, the arrangements being useful in fluorescent ballast circuits and multi-stage filtering.

U.S. Pat. No. 4,462,071, entitled "Supply System", was issued to Blok on July 24, 1984, and shows a supply system with rectified alternating current fed to a load through a smoothing filter.

The above patents are representative of the state of the art in the construction of filters for various uses, and the use of magnetic core devices as power controlling amplifiers, or as part of the filter network with active or passive devices connected in one or more of the magnetic circuit windings.

It is an object of the present invention to provide a new and improved power filter resonant frequency modulation network utilizing a saturable reactor as part of a variable inductance in a power filter network as a frequency and voltage modulated load device.

SUMMARY OF THE INVENTION

In accordance with a preferred embodiment of the present invention, a power filter resonant frequency modulation network is provided for coupling between a load and a variable voltage direct current power source which is subjected to superposition of alternating current thereon, by load devices or by induced currents resulting from radio frequency equipment. Such alternating current frequencies may, for example, be within the range of 30 Hz and 50 kHz, as specified by MIL STD-461A. The filter includes first and second series inductor arrangements in the positive and negative buses between the power supply and the load, with capacitive elements in parallel between the two buses Each series inductor arrangement includes a conventional inductor in series with a second inductive load device, which is a second inductor with a tertiary winding. The tertiary winding is loaded with a coil wound about the core of a saturable loading reactor to provide a frequency and voltage modulated inductive load device, whereby the saturable reactors operate as loading reactors. At frequencies above filter resonance and at lower alternating current voltages, the loading reactors are out of magnetic saturation and present a very high impedance as a load or shunt on the second filter inductor. In this mode of operation, the four passive inductance elements are all active, and with values as set forth herein, each inductance element contributes a $-6$ db attenuation at frequencies above resonance The foregoing and other objects of the invention will become apparent from a reading of the specification, when taken in conjunction with the drawings, in which like reference numerals refer to like elements in the several views

DESCRIPTION OF THE PREFERRED EMBODIMENT

Figure 1:
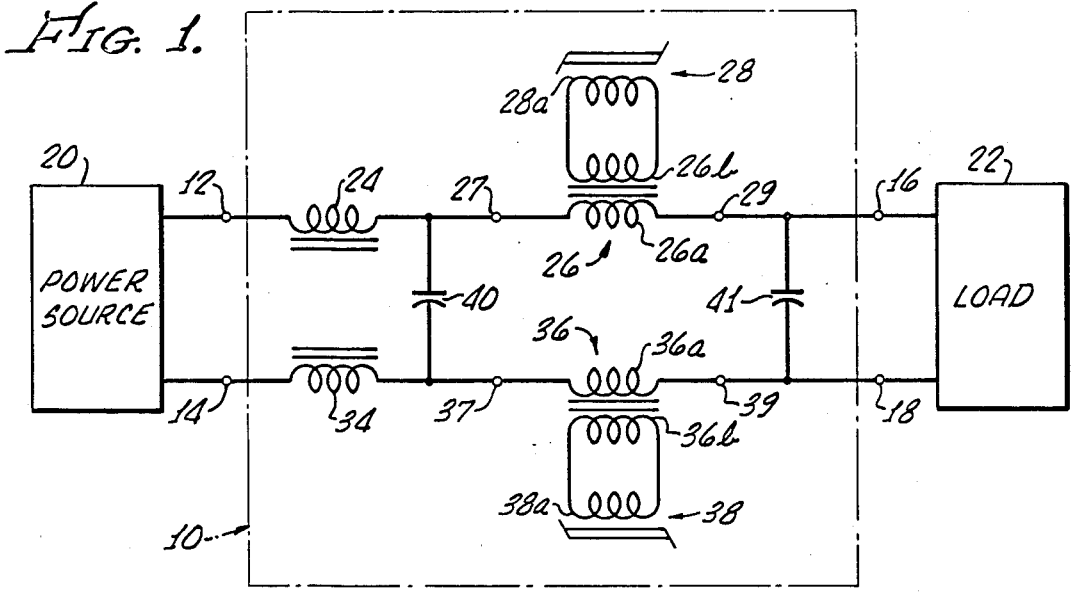
FIG. 1 is a schematic view of the power filter resonant frequency modulation network in accordance with the invention.

Referring now to the drawings, and particularly FIG. 1, there is shown a power filter resonant frequency modulation network, generally designated 10, which includes input terminals 12 and 14, and output terminals 16 and 18, the input terminals 12 and 14 being connected to a power source 20, which is a variable direct current source with alternating current components superimposed thereupon. The output terminals 16 and 18 are connected to a suitable load 22, which may be other circuitry, or may represent multiple loads of various operating characteristics, any one of which may be a radio frequency generating device. With radio frequency equipment, radio frequency noise is generated at the load, and the power filter network herein is employed to attenuate this radio frequency noise and preclude electromagnetic interference on the power lines from the RF noise. In such applications, noise generated from radio frequency sources is generally very high in frequency compared to the power source frequency resulting from rectification, load modulation or load control. Furthermore, the peak voltage amplitude of the generated noise tends to be a significant concern.

As will be hereinafter described, in accordance with an embodiment of the invention, means are provided within the filter network for providing a variable inductive load device, the impedance of which is voltage as well as frequency responsive. For this purpose, first and second series inductor arrangements are connected between the input and output terminals, the first series inductor arrangement including an iron core inductor 24 having one end of its coil connected to positive terminal 12 and the other end of its coil connected to a terminal, designated 27, which is one end of the variable inductive load device, which includes an iron core inductor 26 and a saturable reactor 28 which is electromagnetically coupled thereto and acts as a loading reactor for the inductor 26. The inductor 26 has a coil 26a, one end of which is connected to terminal 27 and the other end of which is designated as terminal 29, which is connected directly to the load, or positive output terminal 16. A second coil 26b wound about the core of inductor 26 is coupled in series with a coil 28a wound about the core of saturable reactor 28. The coil 26b of inductor 26 is thus loaded with the coil 28a of the saturable reactor 28. Such reactors are well known and exhibit hysteresis characteristics that are generally linear up to the point of saturation. As will become obvious, any change in the impedance of the saturable reactor 28 will be reflected in the inductance of the inductor 26 within the filter 10.

A like second series inductor arrangement includes an iron core inductor 34 having one end of its coil connected to negative power terminal 14 and the other end of its coil connected to a terminal, designated 37, which is one end of a second variable inductive load device, which includes an iron core inductor 36 and a saturable reactor 38 which acts as a loading reactor for the inductor 36. The inductor 36 has a coil 36a, one end of which is connected to terminal 37 and the other end of which is designated as terminal 39, which is connected directly to the load, or negative output terminal 18. A second coil 36b wound about the core of inductor 36 is coupled in series with a coil 38a wound about the core of saturable reactor 38. The coil 36b of inductor 36 is thus loaded with the coil 38a of the saturable reactor 38. As will be hereafter described, in operation, the inductance appearing in the circuit between terminals 27 and 29, and likewise between terminals 37 and 39, varies in relation to the alternating current frequencies and the voltage levels on the power buses.

First and second capacitors 40 and 42 are connected in shunt relation between the first and second series inductor arrangements, with capacitor 40 connected between terminals 27 and 37, and capacitor 42 connected between terminals 29 and 39. With the exception of the negligible resistance of the various components, there are no resistive elements in the circuit which would result in IR drops, and power drain.

The direct current source 20 may be, for example, 24 to 36 VDC, with the alternating current components superimposed thereon varying in the frequency range of 30 Hz to 50 kHz, for example. Within this range, as will be hereafter described, the filter network 10 detunes the circuit at resonance, to thus limit the filter gain, and is responsive to both voltage and frequency, in limiting gain. That is, at higher frequencies and lower voltages, the reactors 28 and 38 are out of magnetic saturation and present a very high impedance to the circuit By way of example, and not of limitation, for the filter circuit 10 shown in FIG. 1, the value of inductors 24 and 34 is 62 microhenrys each, with capacitors 40 and 42 each having a value of 68 microfarads. The inductors 24 and 34 may be formed, for example, of 22 turns of No. 12 wire wrapped around a core of ferrite material (manufacturer's designation 55548-A2). Each of the inductors 26 and 36 are identical and rated at 147 microhenrys, and may be formed on a core of ferrite material (manufacturer's designation 58254-A2), with the primary including 29 turns of No. 12 wire, and the secondary winding having 29 turns of No. 22 wire. The windings 28a and 38a of the saturable reactors 28 and 38 are each formed of 33 turns of No. 22 wire wound about a core of ferrite material (manufacturer's designation 52154-1F). With the configurations of core and windings herein described, and with the saturable reactors 28 and 38 coupled to inductors 26 and 36 through coils 28a and 38a, the only current flowing through the coils 28a and 38a is the magnetizing current, which is very low compared to the primary power current flowing through the coils 26a and 36. By way of example, the current flowing through coils 26a and 36a may be fifteen to eighteen amperes, while the current flowing through coils 28a and 38a will be in the milliampere range. Consequently, under operating conditions, the loading reactors are not contributing to a major power reduction at the load 22.

The core material and number of turns of the winding are selected to reflect an extremely high inductance prior to magnetic saturation of loading reactors 28 and 38, with a radical reduction of inductance at magnetic saturation, typically approaching a 300:1 change.

In accordance with the present network of FIG. 1, a magnetic configuration is employed in the power filter network that limits filter gain without sacrificing second order attenuation of higher frequencies for which the filter is designed. In addition, the typical high currents and voltage stress levels at filter resonance are limited This mechanization, through impedance modulation of a magnetic device by shorting of a tertiary winding in response to voltage and/or frequency, changes the filter inductor value as the network approaches resonance, thereby altering the attenuation characteristics of the filter.

In accordance with the invention, each of the reactors 28 and 38 have the characteristic that, in operation in the circuit 10, the firing angle is determined by either frequency or voltage or both. In essence, the firing angles are determined by a measurement of volt-seconds appearing in the tertiary winding, that is, the winding 28a or 38a of the reactors 28 and 38, respectively. At a constant frequency, the firing angle occurs sooner for higher values of voltage and later for lower values of voltage. This is depicted in graphical form in FIG. 2.

Figure 2:
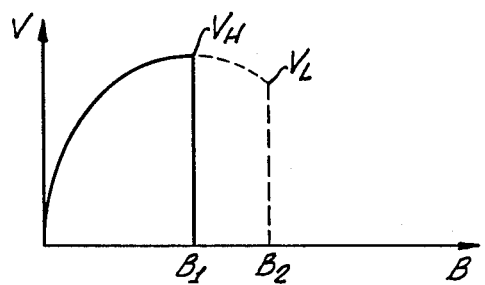
FIG. 2 is a generalized graph depicting the firing angle of the saturable reactors used in the circuit of FIG. 1, as a function of the input audio voltage plus filter gain due to resonance at a fixed frequency.
Figure 3:
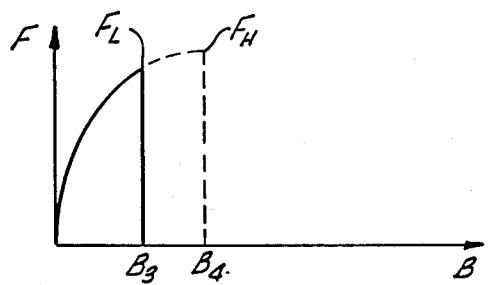
FIG. 3 is a generalized graph depicting the firing angle of the saturable reactors used in the circuit of FIG. 1, as a function of frequency at a fixed voltage.

FIG. 2 depicts a generalized curve, at a constant frequency, of firing angle "B" as a function of the input audio voltage "V" plus filter gain due to resonance at a fixed frequency, for a normal sinusoidal application of power to the tertiary winding 28a or 38a of the reactors 28, 38, respectively. At a higher voltage $V_H$, the firing angle $B_1$ (shown as a solid vertical line) occurs earlier than the firing angle $B_2$ (shown as a dotted vertical line)

at the lower voltage $V_L$. FIG. 3 depicts a generalized curve, at a constant voltage, of firing angle B against frequency "f" for a normal sinusoidal application of power to the windings 28a and 38a. As shown, the firing angle $B_3$ (shown as a solid vertical line) occurs sooner for a lower frequency $f_L$, and the firing angle $B_4$ (shown a a dotted vertical line) occurs later for a higher frequency $f_H$.

Given the parameters of varying voltages and varying frequencies which may be superimposed on the direct current of the power buses, in the filter circuit 10 of FIG. 1, the resultant or composite effect is to modulate, or phase stagger the firing angle of the reactors 28 and 38 in response to voltage, frequency or both. Upon firing the reactors 28 and 38 are in saturation, and upon saturation, the reactors 28 and 38 act as a very high impedance, and are, therefore, out of the circuit. At other frequencies and voltages the reactors present a variable impedance to the circuit, which impedance is reflected at the primary windings of transformers 26 and 36. This is depicted in FIG. 4, which shows a generalized plot of the inductance "L" of one of the variable inductive load devices plotted aganst frequency "f", that is, the inductance which would appear across terminals 27 and 29 (or terminals 37 and 39).

Figure 4:
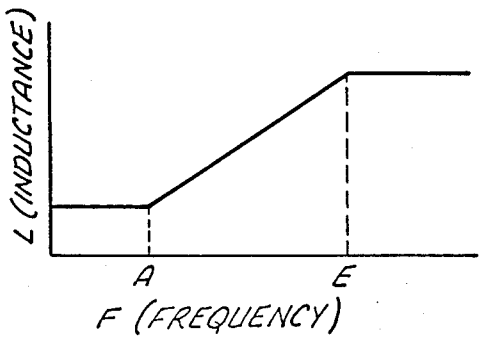
FIG. 4 is a generalized graph depicting the change in inductance of the variable inductive load devices used in the filter network of FIG. 1, plotted as a function of frequency.

In FIG. 4, point "A" represents the lower frequency of the audio frequency range, with point "E" representing the beginning of the EMI frequencies. From point "A" to point "E", the inductance of the variable inductive load device increase in an approximately linear manner, and at point "E", becomes constant at a very high level. Although the graph of FIG. 4 is not to scale, the ratio between the inductance at EMI frequencies to the inductance at low audio frequencies, with proper selection of core material and windings, may typically reach 300 to one.

The characteristics and values of the inductors, capacitors and windings are selected to provide the desired results at the voltage levels and within the frequency range of interest, this frequency range generally being that range at which resonance would occur in the absence of the "detuning" effect of the reactors 28 and 38.

Figure 5:
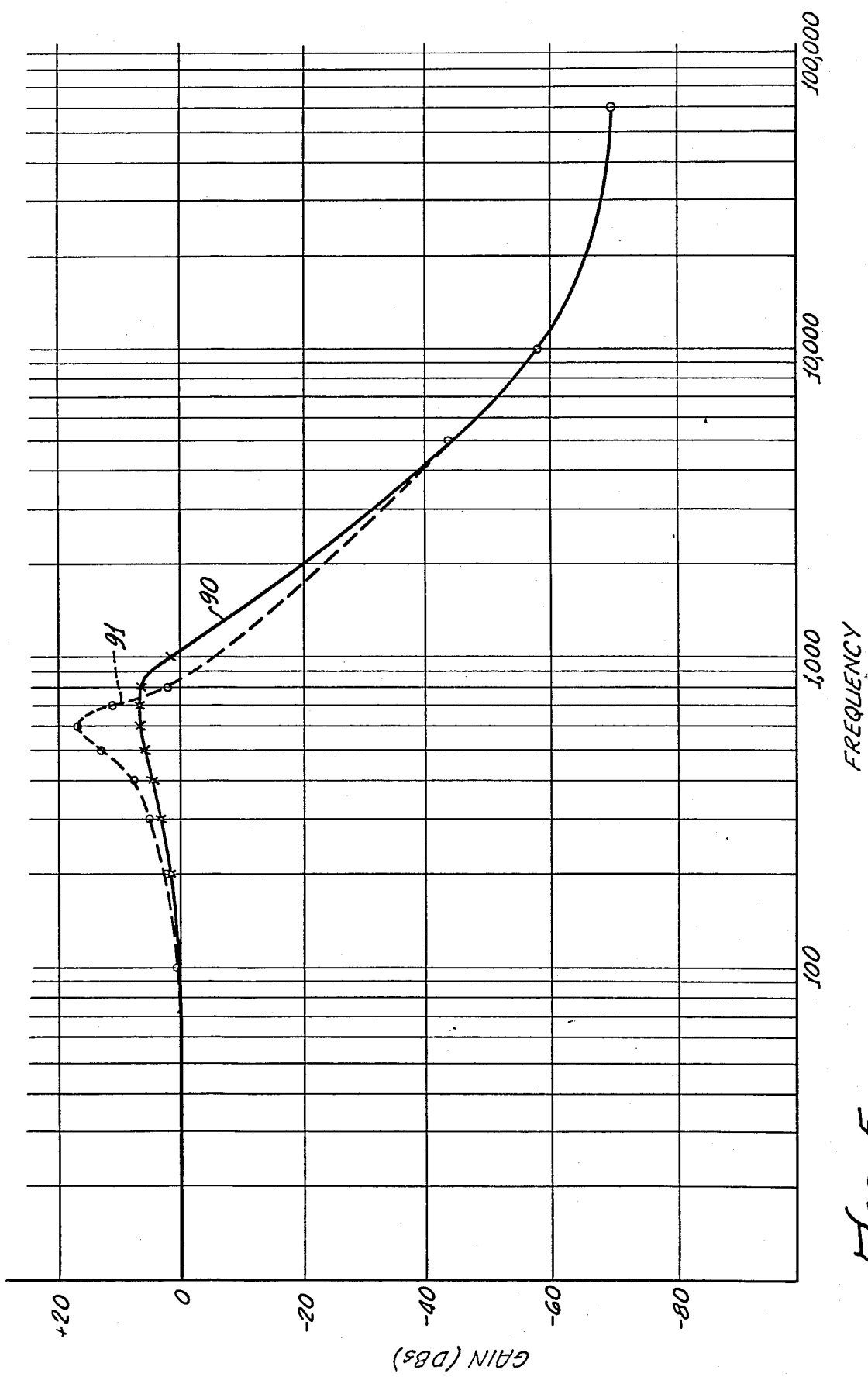
FIG. 5 is a graph of the attenuation characteristics of the power filter resonant frequency modulation network of FIG. 1, with the solid line depicting the characteristics with the reactors connected, and the broken line depicting the characteristics with the reactors opened.

Referring also to FIG. 5, the effect of the voltage and frequency staggered phase firing effect is illustrated by the graph of the attenuation characteristics of the power filter of FIG. 1. The solid line 90 depicts the filter response, or attenuation, characteristics with the reactors 28 and 38 connected, and the broken line 91 depicts the filter response or attenuation characteristics with the reactors 28 and 38 opened. As can be seen, normally at about 600 cycles, without the reactors 28 and 38, resonance is encountered, providing a sharp peak or rise of about 14.5 decibels, while the rise is about 6 decibels with the reactors 28 and 38 operative, thus providing 8.5 decibels of damping at resonance. This curve is obviously illustrative of showing a filter circuit 10 under one set of input conditions and response utilizing the phase staggered firing of reactors 28 and 38. Other curves may likewise be obtainable should the input requirements vary, the primary intention being to provide for magnetic reactor effect through inductance changes in the relevant range of frequencies, in this instance, primarily between 100 and 1,000 Hz.

The power filter network 10, in accordance with the present invention, is intended to attenuate Radio Frequency Noises, generated at the load 22, from conducting into the input power lines, and radiating an electromagnetic interference (EMI). The core material and winding configuration is selected to reflect, at terminals 27 and 29 (as well as terminals 37 and 39), extremely high inductance prior to magnetic saturation and a radical reduction of inductance at magnetic saturation (typically 300:1 change).

Thus, the inductance of the variable inductive load devices varies as a function of frequency and voltage. As filter gain at resonance occurs, by reference to FIG. 2, voltage across the saturable reactors 28 and 38 will increase. This will cause reactor (volt-seconds) saturation to occur at an earlier conduction angle (proportional to the average volt-seconds); and increases in voltage as filter gain at resonance occurs reduce the effective inductance of the associated filter component by shunting the tertiary winding to near zero reflected inductance for a longer percentage of the half period (half cycle).

Correspondingly, by reference to FIG. 3, the inverse effect occurs as frequency increases, resulting in increased reflected inductance (more volt-second support) as high inductance time increases to reduce the saturation period of the half cycle.

In the present embodiment, the loading reactors 28 and 38 have been described as being generally identical, but it is to be understood that each may be constructed differently from the other to thereby generate a predetermined phase staggered inductance modulation to minimize the effects of abrupt impedance changes in both power buses at the same time. While there has been shown and described a preferred embodiment, it is to be understood that various other adaptations and modifications may be made within the spirit and scope of the invention.

What is claimed is:

1. In combination with a power source of variable voltage direct current for providing power to a load circuit and having alternating current components of different frequencies within a range of frequencies superimposed thereon due to load devices or radio frequency equipment or the like, a filter network for interposition between said power source and said load circuit, said filter network comprising first and second inductor means in series relation between said power source and said load circuit, at least one of said inductor means including saturable reactor means electromagnetically coupled thereto and being responsive to frequency and voltage for enabling periodic saturation of said saturable reactor means, said saturable reactor means having the firing angle thereof varying in direct relation to the voltage and in inverse relation to the frequency of the alternating current component for providing inductance changes of said at least one inductor means within said filter network within the range of frequencies.

2. The filter network of claim 1 wherein said at least one inductor means includes a first winding coupled in series between said power source and load, and a second winding coupled to a magnetizing winding of said saturable reactor means.

3. The filter network of claim 2 wherein said at least one inductor means and said saturable reactor means are configured to provide extremely high inductance prior to magnetic saturation of said reactors and a substantial reduction in inductance at magnetic saturation.

4. The filter network of claim 2 wherein said network includes generally identical first and second series inductor arrangements, each including said first and second inductor means.

5. In combination with a power source of direct current for providing power to a load circuit and having alternating current components superimposed thereon, a filter network for interposition between said power source and said load circuit, said filter network comprising:
   a first series inductor arrangement for interconnection between a first terminal of said power source and a first terminal of said load circuit;
   a second series inductor arrangement for interconnection between a second terminal of said power source and a second terminal of said load circuit, each of said first and second series inductor arrangements including
   inductor means including a first winding in series circuit relation between the respective power source terminal and load circuit terminal, said inductor means including a second winding, and
   saturable reactor means having a winding coupled to said second winding, said saturable reactor means having the firing angle thereof varying in direct relation to the voltage and in inverse relation to the frequency of the signal appearing across the first winding of said inductor means for providing inductance changes within said filter network within a given range of frequencies.

6. The filter network of claim 5 further including capacitance means between said first and second series inductor arrangements.

7. The filter network of claim 5 wherein each of said saturable reactor means includes an identically configured saturable reactor.

8. The filter network of claim 5 wherein each of said saturable reactor means includes a saturable reactor, and each of said saturable reactors is configured differently.

9. In combination with a power source of direct current of variable voltage for providing power to a load circuit and having alternating current components of different frequencies within a range of frequencies superimposed thereon, a filter network for interposition between said power source and said load circuit, said filter network comprising:
   first inductance means between said power source and said load circuit;
   other inductive means in circuit relation with said first inductance means and including saturable reactor means electromagnetically coupled thereto and being responsive to frequency and voltage for enabling periodic saturation of said saturable reactor means, said saturable reactor means having the firing angle thereof varying in direct relation to the voltage and in inverse relation to the frequency of the alternating current component for providing inductance changes of said other inductive means within said filter network within the given range of frequencies.

10. The filter network according to claim 9 wherein said given range of frequencies is within the range of frequencies at which resonance would occur in the absence of said other inductive means, and said other inductive means tends to generally reduce filter gain within such range.

11. The filter network according to claim 10 wherein said saturable reactor means are electromagnetically coupled to an inductance device having a winding coupled in series with said first inductance means.

12. In combination with a power source of direct current for providing power to a load circuit and having alternating current components superimposed thereon, a filter network for interposition between said power source and said load circuit, said filter network comprising:
   a first series inductor arrangement for interconnection between a first terminal of said power source and a first terminal of said load circuit and a second series inductor arrangement for interconnection between a second terminal of said power source and a second terminal of said load circuit, each of said series inductor arrangements including
   first inductance means between said power source and said load circuit; and
   second inductive means having a winding in series circuit relation with said first inductance means, a second winding on said second inductance means and saturable reactor means having a winding coupled to said second winding, said saturable reactor means having the firing angle thereof varying in direct relation to the voltage and in inverse relation to the frequency of the signal on said first winding of said second inductance means for providing inductance changes within said filter network within a given range of frequencies.

13. The filter network of claim 12 further including capacitance means between said first and second series inductor arrangements.

14. The filter network of claim 12 wherein each of said saturable reactor means includes an identically configured saturable reactor.

15. The filter network according to claim 12 wherein each of said second inductive means is configured differently to provide phase staggered firing of said saturable reactor means.

* * * * *